United States Patent [19]
Nishimura

[11] Patent Number: 4,933,578
[45] Date of Patent: Jun. 12, 1990

[54] VOLTAGE FOLLOWER CIRCUIT
[75] Inventor: Kouichi Nishimura, Tokyo, Japan
[73] Assignee: NEC Corporation, Tokyo, Japan
[21] Appl. No.: 342,174
[22] Filed: Apr. 24, 1989
[30] Foreign Application Priority Data
  Apr. 27, 1988 [JP] Japan .................. 63-107031
[51] Int. Cl.⁵ .................. H04B 1/10; H03K 3/26
[52] U.S. Cl. .................. 307/542; 307/546; 307/552; 307/553; 307/310; 330/272; 330/288
[58] Field of Search ............. 307/542, 546, 552, 553, 307/310; 330/272, 288

[56] References Cited
U.S. PATENT DOCUMENTS
4,540,951  9/1985  Ozawa et al. .................. 330/288
4,591,739  5/1986  Nagano .................. 330/288
4,620,161 10/1986  Tanaka et al. .................. 330/288

Primary Examiner—Stanley D. Miller
Assistant Examiner—Margaret Rose Wambach
Attorney, Agent, or Firm—Helfgott & Karas

[57] ABSTRACT

A voltage follower circuit is comprised of a plurality of transistors. A first transistor has a base connected to an input terminal and a collector connected to a positive power source terminal. A second transistor of opposite polarity relative to the first transistor has an emitter connected to the emitter of first transistor, and a collector and a base coupled to each other. A third transistor of opposite polarity relative to the first transistor has a base connected to the base of second transistor. A fourth transistor has an emitter connected to the emitter of third transistor, and a collector and a base coupled to each other. A current source is connected at its one end to the first power source terminal and connected at its other end to the collector of fourth transistor. A current mirror circuit is connected at its output port to the collector of second transistor and connected at its input port to the collector of third transistor.

4 Claims, 2 Drawing Sheets

VOLTAGE FOLLOWER CIRCUIT

BACKGROUND OF THE INVENTION

The present invention relates to voltage follower circuits.

The conventional voltage follower circuit is comprised of a pair of transistors having opposite polarities to each other and two electric current sources. The conventional voltage follower circuit will be explained in detail with reference to the drawings. FIG. 1 is a circuit diagram showing one example of the conventional voltage follower circuit.

Referring to FIG. 1, the voltage follower circuit includes NPN transistor Q11 having a collector connected to a positive power source terminal 1, a base connected to an input terminal 3, and an emitter connected to an electric current source $I_1$. PNP transistor Q12 is connected at its base to the emitter of transistor Q11, connected at its collector to a negative power source terminal 2, and connected at its emitter to an electric current source $I_2$ and to an output terminal 4.

When an input voltage is indicated by $V_{IN}$ and an output voltage is indicated by $V_{OUT}$, the output voltage $V_{OUT}$ is represented by the following relations:

$$V_{OUT} = V_{IN} - V_T \ln \frac{I_1}{I_S(Q11)} + V_T \ln \frac{I_2}{I_S(Q12)} \quad (1)$$

$$\therefore V_{OUT} \approx V_{IN} \quad (2)$$

$$\therefore V_{OUT} \approx V_{IN} \quad (2)$$

where
- $V_T$: thermal electromotive voltage ($\approx 26$ mV at t=25° C.)
- Is(Q11): reverse saturation current of transistor Q11
- Is(Q12): reverse saturation current of transistor Q12

In the relation (1), the second and third terms determine an offset voltage; however, as shown by the relation (2), practically the output voltage $V_{OUT}$ is approximately equalized to the input voltage $V_{IN}$ so that the conventional circuit performs the voltage follower function.

In the above described conventional voltage follower circuit, the values of Is(Q11) and Is(Q12) are not essentially matched to each other since the transistors Q11 and Q12 are of different types of NPN and PNP. Further, since the transistors Q11 and Q12 are not perfectly matched to each other with respect to their temperature characteristics, the offset voltage of output voltage $V_{OUT}$ is amounted up to several 100 mV relative to the input voltage $V_{IN}$, thereby causing a drawback that the conventional circuit does not have good temperature characteristic. Moreover, there is another drawback such as the offset voltage fluctuates due to change of a base-emitter forward voltage $V_{BE}$ of the transistor Q12 depending on an output load current.

SUMMARY OF THE INVENTION

An object of the invention is to, therefore, provide the improved voltage follower circuit having good temperature characteristic and good stability of the output voltage level.

According to the present invention, the inventive voltage follower circuit comprises: (A) a first transistor connected at its collector to a first power source terminal; (B) a second transistor having opposite polarity to the first transistor, and having an emitter connected to the emitter of first transistor and collector and base connected mutually to each other; (C) a third transistor having opposite polarity to the first transistor, and being connected at its base to the base of second transistor; (D) a fourth transistor having an emitter connected to the emitter of third transistor, and collector and base connected mutually to each other; (E) an electric current source connected at its one end to the first power source terminal and connected at its other end to the collector of fourth transistor; and (F) a current mirror circuit connected at its output port to the collector of second transistor and connected at its input port to the collector of third transistor.

The inventive voltage follower circuit may further include: (A) a fifth transistor connected at its collector to the collector of second transistor and connected at its emitter to the second power source terminal; and (B) a sixth transistor having a base connected to the base of fifth transistor and to the collector of third transistor, a collector connected mutually to the base thereof, and an emitter connected to the second power source terminal.

The inventive voltage follower circuit may further include: (A) a first resistor interposed between the emitter of first transistor and the emitter of second transistor; and (B) a second resistor interposed between the emitter of fifth transistor and the second power source terminal.

The inventive voltage follower circuit may further include: (A) a third resistor connected at its one end to the collector and base of fourth transistor and connected at its other end to a reference voltage terminal; (B) a seventh transistor connected at its base to the base of sixth transistor and connected at its emitter to the second power source terminal; and (C) an eighth transistor connected at its base to the base of first transistor, connected at its emitter to the collector of second transistor, and connected at its collector to the second power source terminal, the eighth transistor having opposite polarity to the first transistor.

BRIEF DESCRIPTION OF THE DRAWINGS

FIG. 4 is a circuit diagram showing the conventional voltage follower circuit.

DESCRIPTION OF THE PREFERRED EMBODIMENT

Figure 1:
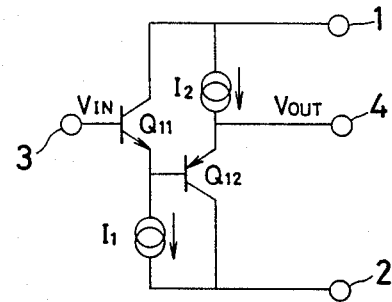
FIG. 1 is a circuit diagram showing the convention voltage follower circuit.
Figure 2:
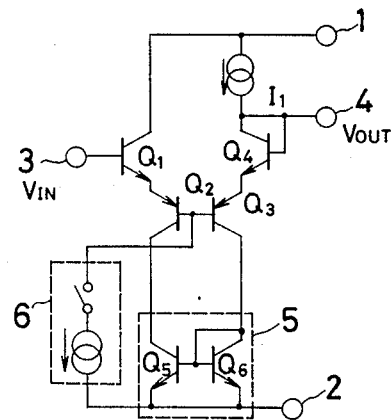
FIG. 2 is a circuit diagram showing a first embodiment of the present invention.

Next, embodiments of the present invention will be explained with reference to the drawings. FIG. 2 is a circuit diagram showing one embodiment of the present invention. The voltage follower circuit shown in FIG. 2 comprises: (A) transistor Q1 connected at its collector to a positive power source terminal 1; (B) transistor Q2 of opposite polarity relative to the transistor Q1, having an emitter connected to the emitter of transistor Q1, and collector and base connected mutually to each other; (C) transistor Q3 of opposite polarity relative to the transistor Q1, connected at its base to the base of transistor Q2; (D) transistor Q4 having an emitter connected to the emitter of transistor Q3, and collector and base connected mutually to each other; (E) an electric current source $I_1$ connected at its one end to the positive power source terminal 1, and connected at its other end to the collector of transistor Q4; (F) transistor Q5 connected at its collector to the collector of transistor Q2 and connected at its emitter to a negative power source terminal 2; and (G) transistor Q6 having a base connected to the base of transistor Q5 and to the collector of transistor Q3, a collector connected mutually to the base of transistor Q6, and an emitter connected to the negative power source terminal 2.

Next, the operation will be explained. The transistor Q1 operates as an input buffer and the transistor Q4 operates as an output buffer. The pair of transistors Q5 and Q6 constitute a current mirror circuit 5 operative to detect an output current and to transmit a current proportional to the detected output current to an input stage of the circuit.

A start-up circuit 6 connected to the bases of transistors Q2 and Q3 operates to flow a current only at the time of start and to turn off once after the circuit is started. However, since the starting current is set to rather considerably small value, it is not necessary to turn off the start-up circuit 6 if the value of starting current is much smaller than that supplied from the current source $I_1$.

When $I_0$ indicates a collector current of the transistor Q6 operative to detect the load current and it is assumed that ground current amplification rate of each transistor is sufficiently great, all of the collector currents of transistors Q1–Q6 become equal to each other. Therefore, the relation between $V_{IN}$ and $V_{OUT}$ is represented as follow:

$$V_{OUT} = V_{IN} - V_T l_n \frac{I_0}{I_{s(Q1)}} - V_T l_n \frac{I_0}{I_{s(Q2)}} + \qquad (3)$$

$$V_T l_n \frac{I_0}{I_{s(Q3)}} + V_T l_n \frac{I_0}{I_{s(Q4)}}$$

Since NPN transistors are easily matched to each other and PNP transistors are easily matched to each other, the following relations $I_{s(Q1)} = I_{s(Q4)}$ and $I_{s(Q2)} = I_{s(Q3)}$ are approximately established. Thus, the relation (3) is simplified as:

$$V_{OUT} = V_{IN} \qquad (4)$$

The relation (4) represents the voltage follower function.

By equalizing all of the collector currents of the transistors Q1–Q4 with each other for any output load current condition, $V_{BE}$ (voltage between the base and emitter) of the transistor Q1 and $V_{BE}$ of the transistor Q4 are equalized to each other, and $V_{BE}$ of the transistor Q2 and $V_{BE}$ of the transistor Q3 are equalized to each other. Accordingly, the values of $V_{BE}$ of the respective transistors are canceled to each other so that the base potential (at the input terminal) of transistor Q1 and the other base potential (at the output terminal) of transistor Q4 are set to the same potential level to thereby perform the voltage follower function.

Figure 3:
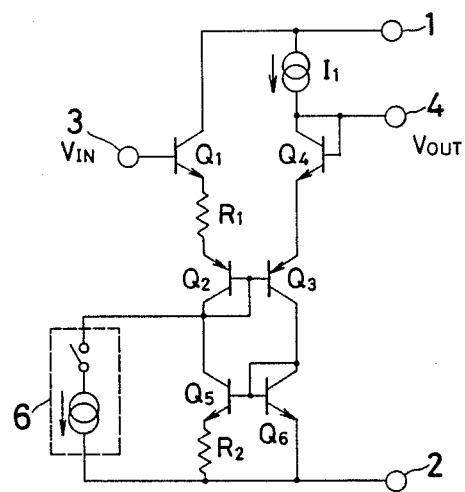
FIG. 3 is a circuit diagram showing a second embodiment of the present invention.

FIG. 3 is a circuit diagram showing a second embodiment of the present invention. The voltage follower circuit shown in FIG. 3 includes additionally: (A) a resistor R1 interposed between the emitter of transistor Q1 and the emitter of transistor Q2; and (B) a resistor R2 interposed between the emitter of transistor Q5 and the negative power source terminal 2.

The fundamental feature of this embodiment is similar to that of the first embodiment shown in FIG. 2. Namely, the potential difference from the base of transistor Q1 to the base of transistor Q2 is made equal to the potential difference from the base of transistor Q4 to the base of transistor Q3 with respect to a symmetrical point at the junction of mutually connected bases of transistors Q2 and Q3 so that the base potential (at the input terminal) of transistor Q1 is equalized to the base potential (at the output terminal) of transistor Q4. Namely, parameters of the transistors Q5 and Q6 and the resistor R2 are determined so that the total voltage of $V_{BE}$ of the transistor Q1, drop voltage of the resistor R1 and $V_{BE}$ of the transistor Q2 is equalized with the other total voltage of $V_{BE}$ of the transistor Q4 and $V_{BE}$ of the transistor Q3.

When $I_I$ indicates the collector current of transistor Q5, the relation between $V_{IN}$ and $V_{OUT}$ is represented as follow:

$$V_{OUT} = V_{IN} - V_T l_n \frac{I_I}{I_{s(Q1)}} - V_T l_n \frac{I_I}{I_{s(Q2)}} + \qquad (5)$$

$$V_T l_n \frac{I_0}{I_{s(Q3)}} + V_T l_n \frac{I_0}{I_{s(Q4)}} - I_I R_1$$

Further, the circuit parameters of transistors Q5 and Q6 and resistor R2 are set to satisfy the following relation:

$$V_T l_n \frac{I_0}{I_{s(Q6)}} = I_I R_2 + V_T l_n \frac{I_I}{I_{s(Q5)}} \qquad (6)$$

According to the relation (4) and the matching feature of each pair of transistors, conditions are obtained such as $I_{s(Q1)} = I_{s(Q4)}$, $I_{s(Q2)} = I_{s(Q3)}$ and $I_{s(Q5)} = I_{s(Q6)}$. By using these conditions, the relations (5) and (6) are converted as follows:

$$V_{OUT} = V_{IN} - I_I R_1 + 2V_T l_n \frac{I_0}{I_I} \qquad (7)$$

$$V_T l_n \frac{I_0}{I_I} = I_I R_2 \qquad (8)$$

According to the relations (7) and (8), $V_{OUT}$ is represented as follow:

$$V_{OUT} = V_{IN} - I_I R_1 + 2I_I R_2 \qquad (9)$$

According to the relations (4) and (9), the condition to null the offset voltage so as to perform the function of voltage follower is represented as follow:

$$R_1 = 2R_2 \qquad (10)$$

In this embodiment, the value of resistor R2 is set relatively great so as to reduce the collector current of input buffer transistor Q1 to thereby cause the effect that the input bias current can be reduced.

Figure 4:
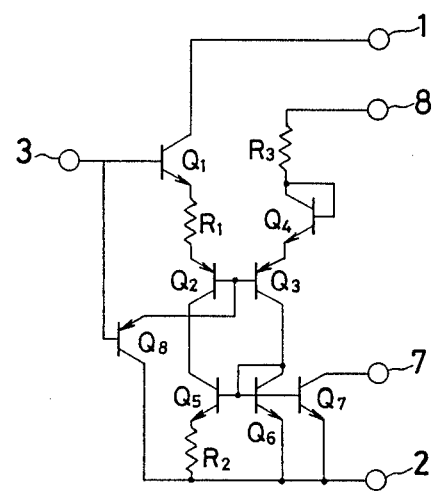
FIG. 4 is a circuit diagram showing a third embodiment of the present invention.

FIG. 4 is a circuit diagram showing the third embodiment of the present invention. The voltage follower circuit shown in FIG. 4 includes: (A) a resistor R3 connected at its one end to the coupled collector and base of transistor Q4 and connected at its other end to a reference voltage terminal 8; (B) a seventh transistor Q7 connected at its base to the base of transistor Q6 and connected at its emitter to the negative power source terminal 2; and (C) an eighth transistor Q8 having opposite polarity to the transistor Q1, and being connected at its base to the base of transistor Q1, connected at its emitter to the collector of transistor Q2 and connected at its collector to the negative power source terminal 2.

In this embodiment, the current source I₁ of FIG. 3 is replaced by the resistor R3 inserted therefor. The transistor Q8 operates as a start-up circuit only at the starting time, and is turned off after the starting time due to reverse bias between the base and emitter.

Since the base of transistor Q1 and the base of transistor Q4 are held at the same potential, a current having magnitude determined by dividing the voltage difference between the input voltage and the reference voltage by the resistance of resistor R3 is flown from the transistor Q4, through the transistor Q3 and to the transistor Q6. Further, since the transistors Q6 and Q7 constitute a current mirror circuit, a voltage-current-converted current is outputted from the collector of transistor Q7.

When the circuit element parameters are set as similar to the FIG. 3 embodiment and the voltage at the reference voltage terminal 8 is set to zero V, since the voltage at one end of the resistor R3 is held the same potential as the input voltage $V_{IN}$, the collector current $I_{OUT}$ of transistor Q7 is represented as follow:

$$I_{OUT} = \frac{V_{IN}}{R3} \qquad (11)$$

Accordingly, the voltage-current-converted output current is obtained from a current output terminal 7 connected to the collector of transistor Q7.

According to the present invention, the voltage follower circuit operates to detect the output current so as to match the voltage $V_{BE}$ between the base and emitter of input transistor to the other voltage $V_{BE}$ between the base and emitter of output transistor even when the load current varies to thereby cause an effect that the offset voltage is not produced.

Further, there is another effect that the input bias current can be reduced by simply adding two resistors without increasing the offset voltage.

Moreover, there is further effect that a voltage-current conversion circuit can be formed with a simplified circuit equivalent to the conventional operational amplifier.

What is claimed is:

1. A voltage follower circuit comprising:
   (A) a first transistor having a base connected to an input terminal, a collector connected to a first power source terminal, and an emitter;
   (B) a second transistor of opposite polarity relative to said first transistor, having an emitter connected to said emitter of first transistor, and a collector and a base coupled to each other;
   (C) a third transistor of opposite polarity relative to said first transistor, having a base connected to said base of second transistor, and an emitter and a collector;
   (D) a fourth transistor having an emitter connected to said emitter of third transistor, and a collector and a base coupled to each other;
   (E) a current source connected at its one end to said first power source terminal and connected at its other end to said collector of fourth transistor; and
   (F) a current mirror circuit having an output port connected to said collector of second transistor, and an input port connected to said collector of third transistor.

2. A voltage follower circuit as claimed in claim 1, wherein said current mirror circuit includes:
   (A) a fifth transistor having a collector connected to said collector of second transistor, an emitter connected to a second power source terminal, and a base; and
   (B) a sixth transistor having a base connected to said base of fifth transistor and to said collector of third transistor, a collector coupled to said base of sixth transistor, and an emitter connected to said second power source terminal.

3. A voltage follower circuit as claimed in claim 2, including:
   (A) a first resistor interposed between said emitter of first transistor and said emitter of second transistor; and
   (B) a second resistor interposed between said emitter of fifth transistor and said second power source terminal.

4. A voltage follower circuit as claimed in claim 2 or 3, including:
   (A) a third resistor connected at its one end to said collector and base of fourth transistor and connected at its other end to a reference voltage terminal;
   (B) a seventh transistor having a base connected to said base of sixth transistor, and an emitter connected to said second power source terminal; and
   (C) an eighth transistor of opposite polarity relative to said first transistor, having a base connected to said base of first transistor, an emitter connected to said collector of second transistor, and a collector connected to said second power source terminal.

* * * * *